United States Patent [19]

Ovens

[11] Patent Number: 4,855,617
[45] Date of Patent: Aug. 8, 1989

[54] SCHOTTKY TRANSISTOR LOGIC FLOATING LATCH FLIP-FLOP

[75] Inventor: Kevin M. Ovens, Garland, Tex.

[73] Assignee: Texas Instruments Incorporated, Dallas, Tex.

[21] Appl. No.: 214,921

[22] Filed: Jun. 30, 1988

Related U.S. Application Data

[63] Continuation of Ser. No. 944,493, Dec. 19, 1986, abandoned.

[51] Int. Cl.[4] .................. H03K 3/286; H03K 3/289
[52] U.S. Cl. .................. 307/291; 307/272.2; 307/317.2
[58] Field of Search ........... 307/289, 291, 530, 317 A, 307/272.2, 292

[56] References Cited

U.S. PATENT DOCUMENTS 3,912,950 10/1975 Tada .................. 307/291
4,491,745 1/1985 Birch .................. 307/291
4,591,737 5/1986 Campbell .................. 307/291

FOREIGN PATENT DOCUMENTS 5544228 3/1980 Japan .................. 307/291

*Primary Examiner*—John Zazworsky
*Attorney, Agent, or Firm*—Thomas R. FitzGerald; Leo N. Heiting; Melvin Sharp

[57] ABSTRACT

The disclosure relates to an STL flip flop circuit composed of a pair of latch circuits, the first latch circuit receiving R and S inputs and the clock signal and floating relative to the other latch circuit. The second latch circuit is referenced to ground and is driven by the output of the floating latch circuit. All components are of the schottky type, the semiconductor devices being schottky clamp transistors and the diodes being either TiW or PtSi type. In accordance with a second embodiment of the invention, a pair of inverter circuits are each coupled to the R and S inputs of the first embodiment, one of the inverters being controlled by an external data source, whereby, the inverters always each provide opposite outputs to the R and S inputs, depending upon the data input. Schottky clamp transistors and two different types of schottky diodes are utilized.

15 Claims, 1 Drawing Sheet

SCHOTTKY TRANSISTOR LOGIC FLOATING LATCH FLIP-FLOP

This application is a continuation of application Ser. No. 944,493, filed Dec. 19, 1986, now abandoned.

BACKGROUND OF THE INVENTION

1. FIELD OF THE INVENTION

This invention relates to flip flop circuits and, more specifically, to flip flops of the RS and D type using schottky transistor logic (STL).

2. BRIEF DESCRIPTION OF THE PRIOR ART

STL is a VLSI type of logic wherein almost all operations are performed at the gate level. A problem with STL logic is that everything must work from a two volt power supply instead of a five volt supply. For this reason, prior art STL devices, when conformed, for example, to provide a D type flip flop, required a pair of data gates, a pair of clock gates and a pair of output gates. A typical such configuration as shown in FIG. 1 requires about thrity-one components and involves three gate delays from the clock to the output. It is evident that, not only is it desirable to reduce the number of components in order to improve yield and increase the logic function density of the semiconductor chip, but also, that a reduced number of components will provide a decrease in the power requirement for performance of the logic function involved.

SUMMARY OF THE INVENTION

In accordance with the present invention, there is provided an STL flip flop circuit which includes a floating latch to replace the clock gates of the prior art STL flip flops and which provides the above noted desirable properties of utilizing fewer components than prior art STL flip flops, thereby providing an improvement in yield, economizing on chip real estate and using less power to perform a given function. In addition, the speed of operation is increased due to the elimination of a gate delay required by the above noted prior art.

Briefly, in accordance with a first embodiment of the present invention, there is provided an RS type flip flop which utilizes two different types of schottky diodes and schottky clamp transistors. The flip flop is composed of a pair of latch circuits, the first latch circuit having no reference voltage thereon or, in other words, floating and receiving the inputs to the flip flop as well as the clock signal thereto. The floating latch circuit is a bistable circuit and provides the base drive for the transistors of a second latch circuit which is referenced to a predetermined reference voltage and provides the flip flop output on its two output terminals, the output being based upon the status of the input thereto from the floating latch circuit.

In accordance with a second embodiment of the invention, the RS type flip flop of the first embodiment is converted into a D type flip flop by the addition of a pair of inverter circuits, each coupled to one of the R bar and S bar inputs of the first embodiment. The component complement, other than the inverter circuits, is the same as that of the first embodiment, with a single input to the base of the transistor of one of the inverters. In accordance with this embodiment, the pair of inverter circuits is connected such that, when one inverter is on, the other inverter is off. In this manner, the signal applied to the R bar input of the RS flip flop of FIG. 2 will be the complement of the S bar input thereto, thereby avoiding the illegal condition whereby both of the R bar and S bar inputs are high or on.

DESCRIPTION OF THE PREFERRED EMBODIMENTS

Figure 1:
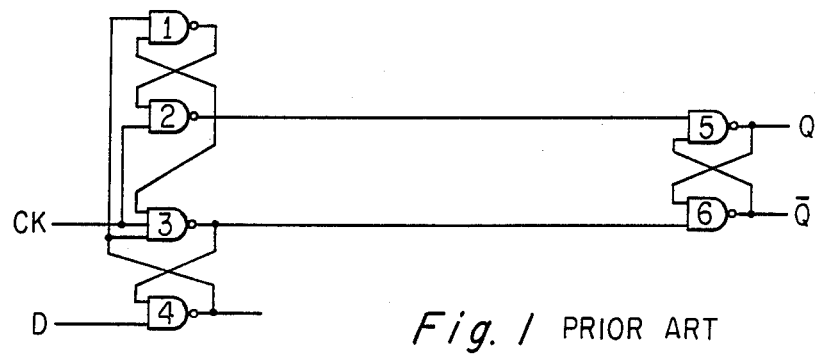
FIG. 1 is a diagram of a typical prior art STL flip flop which is D type implemented at the gate level.

Referring first to FIG. 1, there is shown a diagram of a typical prior art STL flip flop which is D type implemented at the gate level. The circuit as shown requires thirty one (31) components and requires three gate delays from the clock input to the output. As stated above, a circuit of this type, when implemented in VLSI (very large scale integration) will require a relatively large amount of chip real estate, thereby minimizing the number of functional operating circuits available on the chip, decreasing the yield due to the additional number of components required, and providing relatively reduced operating speed due to the requirement of three gate delays. These levels of delay are indicated by the data gates 1 and 4 with the data input being applied to one of the inputs of gate 4, the clock gates 2 and 3 with the clock input being applied to one of the inputs of gate 2 and gate 3 and the output gates 5 and 6 with the outputs Q and Q bar being taken from gates 5 and 6 respectively. The outputs of each of the gates also provide the inputs for other gates as shown in the drawing. Each transistor in this circuit requires collector and base resistors, this being a major reason for the additional component and power requirement of this circuit, which is typical of the prior art.

In operation, assuming a "1" or high voltage on the D input of FIG. 1, and assuming that the clock is at low voltage, the outputs of gates 2 and 3 will be high. This provides a high on the internal input to gate 4 and, with D high, the output of gate 4 is low and the upper input on gate 1 is also low. Since one of the inputs on gate 1 is low, the output thereof is high to provide a high on the input to gate 2 and a low on the input to gate 3 due to the D input. When the clock goes to a high voltage level, gate 2 is turned on and provides a low output, this forcing gate 5 to go high at its output to turn on gate 6. This causes the output of gate 6 to go low to clock a "1" through the prior art flip flop.

For a "0" or low voltage on the D input of FIG. 1, and assuming that the clock is low, the output of gate 3 is high and the output of gate 4 is high. Accordingly, the output of gate 2 will also be high and the output of gate 1 will be low. Therefore, during a clock pulse, gate 3 will go low and gate 2 will stay high, these signals being propogated to gates 5 and 6 on the rising edge of the clock pulse so that the output of gate 5 goes low and the output of gate 6 goes high to clock a "0" through the flip flop.

Figure 2:
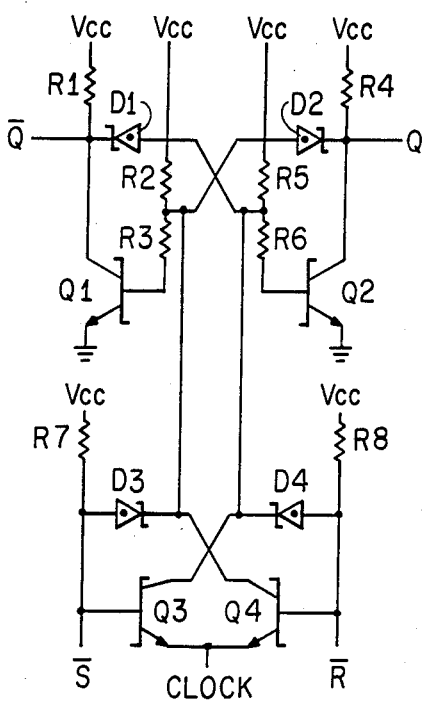
FIG. 2 is a circuit diagram of an STL flip flop of RS type in accordance with the present invention.

In accordance with the present invention, essentially the clock gates 2 and 3 of FIG. 1 of the prior art, are replaced by a floating latch as shown in FIG. 2. The floating latch is composed of a pair of schottky clamp transistor Q3 and Q4, the base of each being coupled to the S bar and R bar inputs respectively and, through resistors R7 and R8 to Vcc (+2 volts). The emitters thereof are coupled to the clock input and the collectors are coupled to the base of the other transistor of the floating latch through a TiW schottky diode D3 and D4. Each collector also has a lead coupled to the other latch as will be discussed hereinbelow. The floating latch provides an emitter follower or emitter coupled logic type gate delay. Therefore, when a clock pulse causes one of the transistors Q3 or Q4 of the latch to turn on, the collector thereof goes low at substantially the same rate as the clock pulse thereto, thereby providing almost zero (about 0.1 to 0.2 that of the prior art) delay through the floating latch. In the prior art, the signal must go through gate 2 or gate 3 (FIG. 1) which provides a one gate delay. Also, the floating gate includes only six components whereas the clock gates of the prior art include about thirteen components.

The upper latch circuit (FIG. 2) receives inputs from the floating latch and provides the outputs Q and Q bar. The upper latch is composed of a pair of schottky clamp transistors Q1 and Q2 with the output Q bar being taken from the collector of transistor Q1 and the output Q being taken from the collector of transistor Q2. The output from the collector of transistor Q4 is coupled to the base of transistor Q1 through resistor R3, to Vcc through resistor R2 and to output Q via TiW schottky diode D2. The output from the collector of transistor Q3 is coupled to the base of transistor Q2 through resistor R6, to Vcc through resistor R5 and to output Q bar via TiW schottky diode D1. The Q bar output is coupled to Vcc via resistor R1 and the Q output is coupled to Vcc via resistor R4.

The output gates of the present invention operate in the same manner as in the prior art. Whereas the output gate 5 (FIG. 1), for example, requires a signal from clock gate 2 and the output Q bar from output gate 6, the Q output gate of the present invention also requires signals from the Q bar output and the floating latch. Therefore, the upper latch of the present invention is quite similar in operation to that of the prior art except that the threshold is changed to insure that the floating latch does not disrupt the output when the floating latch is disabled by the clock going high. The floating latch loads data when the clock goes high and either R bar or S bar is set low, it being noted that both the R bar and S bar inputs cannot be high simultaneously by definition, this being an illegal condition. To protect against this illegal condition, it is preferable that data be input to one of inputs R bar and S bar and that data bar be input to the other of the inputs R bar and S bar. This data is transferred on the negative edge of the next clock pulse to the output gates of the upper latch. The R bar of S bar input must float to and clamp at high enough level so as not to disrupt the clock when the clock is low. Therefore, resistors R3 and R6 are required to keep the base of transistor Q2 or Q1 from clamping the base of transistor Q3 or Q4 to too low a level so the data will not load.

To compare the prior art embodiment of FIG. 1 with that of FIG. 2, with the clock low in the prior art, the outputs of gates 2 and 3 were high and the output latch section composed of gates 5 and 6 remained in the state previous to the clock. With the floating latch, with the clock high, transistors Q3 and Q4 do not conduct, resulting in highs on the output gates which go into resistors R2, R3, R5 and R6. Therefore the clock being high in the floating latch embodiment is the same as the clock being low in the prior art. With the floating latch circuit, as the clock goes low, then either the R bar or S bar input is higher than the other (both cannot be the same). In operation, referring to FIG. 2, assuming R bar is higher than S bar, as the clock goes low, the base of transistor Q4 will turn on transistor Q4 before the base of transistor Q3 can turn on transistor Q3 on the falling edge of the clock pulse (as the clock pulse wave falls). When transistor Q4 turns on, diode D3 conducts to keep transistor Q3 off. Therefore resistor R7 conducts through diode D3, through the collector of transistor Q4 and to the clock and resistor R8 conducts into the base of transistor Q4 and out to the clock. Therefore, as the clock voltage gets lower, the collector of transistor Q4 becomes low enough to turn off transistor Q1. When the collector of transistor Q1 goes high, resistor R5 switches from conducting through diode D1 to conducting into the base of transistor Q2. This switches the output latch. Therefore, the R bar and S bar data is loaded to the output Q and Q bar on the falling edge of the clock at the floating latch whereas, with the prior art, the clock changes on the rising edge and then the logic gates 2 or 3 switch and then the output switches. The increase in speed of operation due to the operation of the floating latch upon commencement of the falling edge of the clock pulse causes an increase in speed of operation since the prior art must wait for a full gate delay. It is apparent that, if input S bar is high and input R bar is low, the conditions on the transistors of both latch circuits would be reversed.

It can be seen that the floating latch of the present invention operates at greater speed than the prior art system, has fewer components and operates with much less power due to the smaller number of resistors in the circuit and the ability to operate at two volts power of Vcc. This is accomplished by using the STL diodes and being able to adjust the threshold of the output gates.

Figure 3:
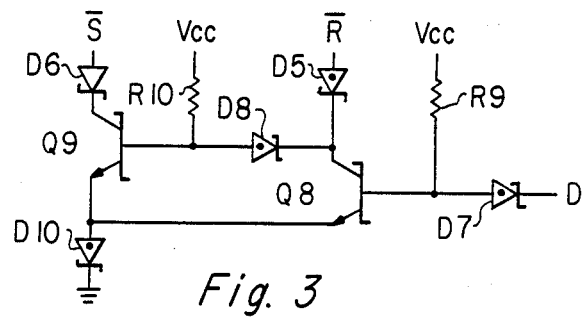
FIG. 3 is a circuit diagram of an additional circuit which converts the circuit of FIG. 2 into a D type flip flop.

The R bar-S bar flip flop of the floating latch of FIG. 2 can be made into a D type flip flop by adding a pair of inverters of the type shown in FIG. 3. The R bar and S bar terminals of FIUGRE 3 would be attached to the R bar and S bar inputs respectively of FIG. 2 with the D input being provided at terminal D of FIG. 3. This circuit prevents the possibility of an illegal input, such as both R bar and S bar being high simultaneously. This circuit forces R bar and S bar to be of opposite voltage state. When data D goes high, current travels through resistor R9 to the base of transistor Q8 which transistor then turns on. Resistor R10 on the base of transistor Q9 conducts through diode D8 and turns transistor Q9 off. Therefore with data D high, transistor Q8 is on and transistor Q9 is off. Therefore the S bar input will float up to a higher level (Vcc) than the R bar input. The S bar input will therefore be at 2 volts and the R bar input will be clamped through diode D5 (about 0.6 volts) and transistor Q8 (about 0.2 volts) and TiW diode D10 (about 0.3 volts) to ground, therefore clamping the R bar input at about 1.1 volts. Accordingly, when transistor Q3 starts to turn on, the clock will be at 1.2 volts and transistor Q4 will start to turn on when the clock is at 0.3 volts [R bar (1.1 volts)—Vbe Q4 (0.8 volts)]. In the above example, transistor Q3 will turn on faster because the base voltage thereof is higher.

Referring again to FIG. 3, if the D input is low (a logical "0"), then resistor R9 conducts through diode D7 and transistor Q8 will be off. With transistor Q8 off, the resistor R10 will conduct into the base of transistor Q9 and turn that transistor on. The R bar input will therefore be high and the S bar input will be low. The floating latch circuit will again operate as described above, except that the opposite transistors will be conducting and non conducting.

It can be seen that there has been provided circuitry which utilizes different types of schottky diodes to provide flip flop circuits having the above noted beneficial properties as compared with such prior art devices.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. An STL flip-flop circuit comprising:
   (a) a first latch circuit having first and second input terminals and first and second output terminals;
   (b) a second latch circuit comprising:
      (i) first and second input terminals,
      (ii) first and second output terminals connected respectively to the first and second input terminals of the first latch,
      (iii) first and second transistors, each with an emitter, base and collector, the base of each connected to a different second latch input terminal and the collector of each connected to a different second latch output terminal,
      (iv) first and second unidirectional coupling means, each unidirectional coupling means connected from the base of one transistor to the collector of the other transistor to switch the current from the base of one of the transistors to the collector of the other transistor and each of said unidirectional coupling means having a forward voltage drop less than the forward voltage drop of the base-emitter junction of the first and second transistors.

2. The circuit of claim 1 wherein the emitters of both transistors are connected to a common clock signal.

3. The circuit of claim 2 wherein input data placed on the respective first and second input terminals of the second latch are transferred to the output terminals of said latch when the common clock signal falls to a low level.

4. The circuit of claim 2 wherein one of the unidirectional coupling means transfers the base current in one transistor to the collector of the other transistor when the common clock falls to a low level.

5. The circuit of claim 4 wherein the transfer occurs on the falling edge of a clock pulse signal.

6. The circuit of claim 1 wherein the unidirectional coupling means comprise low barrier Schottky diodes.

7. The circuit of claim 6 wherein the unidirectional coupling means comprise titanium-tungsten Schottky diodes.

8. The circuit of claim 1 wherein the unidirectional coupling means comprises diodes and the anode of each diode is connected to a base of a different transistor.

9. The circuit of claim 8 wherein the cathode of each diode is connected to a collector of a different transistor.

10. The circuit of claim 1 further comprising an inverter coupled to the inputs of the second latch for maintaining the level of input signal at different logic levels.

11. The circuit of claim 10 wherein the inverter circuit comprises a third unidirectional coupling means and third and fourth transistors with the unidirectional coupling means connected between the base of the third transistor and the collector of the fourth transistor.

12. The circuit of claim 11 wherein the emitter of the third transistor is coupled to the first input of the second latch and the emitter of the fourth transistor is coupled to the second input of the second latch.

13. The circuit of claim 11 wherein the unidirectional coupling means comprises a Schottky barrier diode.

14. The circuit of claim 13 wherein the anode of the Schottky barrier diode is coupled to the base of the third transistor and the cathode is coupled to the collector of the fourth transistor.

15. The circuit of claim 14 comprising a fourth Schottky barrier diode connected between the emitter of the third transistor and a reference voltage.

* * * * *